(12) United States Patent
Van Donkelaar et al.

(10) Patent No.: US 7,271,917 B2
(45) Date of Patent: Sep. 18, 2007

(54) LITHOGRAPHIC APPARATUS, POSITION QUANTITY DETECTION SYSTEM AND METHOD

(75) Inventors: Edwin Teunis Van Donkelaar, Eindhoven (NL); Evert Hendrink Jan Draaijer, Eindhoven (NL); Leon Martin Levasier, Hedel (NL); Nicolas Alban Lallemant, Veldhoven (NL); Gerardus Martinus Antonius De Rooij, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 214 days.

(21) Appl. No.: 11/120,193

(22) Filed: May 3, 2005

(65) Prior Publication Data

US 2006/0250617 A1 Nov. 9, 2006

(51) Int. Cl.
*G01B 11/02* (2006.01)
(52) U.S. Cl. .................................... 356/500
(58) Field of Classification Search ................ 356/72, 356/73, 124, 496, 498, 500, 517; 355/53
See application file for complete search history.

(56) References Cited

U.S. PATENT DOCUMENTS

| | | | | |
|---|---|---|---|---|
| 5,127,735 A | * | 7/1992 | Pitt | ........................... 356/500 |
| 5,270,771 A | * | 12/1993 | Sato | ........................... 355/53 |
| 5,552,888 A | * | 9/1996 | Sogard et al. | .............. 356/500 |
| 5,708,505 A | * | 1/1998 | Sogard et al. | .............. 356/500 |
| 5,963,324 A | * | 10/1999 | Murata | ..................... 356/509 |
| 6,987,557 B2 | * | 1/2006 | Pril et al. | ..................... 355/71 |
| 2006/0072089 A1 | * | 4/2006 | Eussen et al. | ................. 355/53 |

* cited by examiner

*Primary Examiner*—Michael A. Lyons
(74) *Attorney, Agent, or Firm*—Pillsbury Winthrop Shaw Pittman LLP (57) ABSTRACT

A lithographic apparatus includes a position quantity determination system to determine a position quantity of a movable part which is in operation at least partly surrounded by an area comprising a fluid. The position quantity determination system includes an interferometer system, a global sensor to determine a global value of a physical quantity of the fluid in the area, and a local sensor to determine a local value of the physical quantity of the fluid in the part of the area. The position quantity determination system is configured to determine the position quantity from an output of the interferometer, the global value of the physical quantity and the local value of the physical quantity. The physical quantity may include a pressure, a temperature, etc. The local physical quantity determination system may include a sensor, such as a high-speed sensor, a computational fluid dynamics model or a linear approximation model.

18 Claims, 3 Drawing Sheets

LITHOGRAPHIC APPARATUS, POSITION QUANTITY DETECTION SYSTEM AND METHOD

BACKGROUND

1. Field of the Invention

The present invention relates to a lithographic apparatus and a position quantity determination system and method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the state of the art it is known to determine a position of a movable part of the lithographic apparatus making use of an interferometer. The interferometer emits an optical measurement beam from a source to the movable part. The measurement beam is then, e.g., reflected by the movable part and detected by a detector. Also, the measurement beam, or a part thereof, may be directed from the source to the detector via another optical path. At the detector, the two beams arriving there will interfere resulting in a wavelength related readout. Upon movement of the movable part, a distance traveled by the measurement beam from the source via the movable part to the detector will change, thus resulting in a phase shift of the measurement beam when arriving at the detector, which results in a change in the interference pattern. Making use of the interferometer, accurate position measurements, whether absolute or relative, depending on the type and construction of interferometer used, may be performed. It is know that the readout of the interferometer is related to a wavelength of the measurement beam, which in turn depends on physical parameters of a fluid, such as a gas or a liquid, through which the measurement beam is transmitted. In other words, readout of the interferometer is dependent on a wavelength of the measurement beam. The wavelength of the measurement beam depends on physical parameters, such as a pressure or a temperature of the fluid via which it is transmitted. It is known to measure such physical parameter, making use of a sensor, e.g., a pressure sensor in case that the physical parameter includes a pressure or a temperature sensor, in case that the physical parameter includes a temperature.

The above solutions may work sufficiently well in a static environment where no movable parts are present or where an insignificant effect of any movements of movable parts on the fluid is observed. In a lithographic apparatus, however, structures may be present which may have comparably large dimensions and which may move at a comparably high speed and with a high repetition frequency. Examples of such movable structures (in other words movable parts) may include a substrate table, a measurement table in a dual scan configuration, or any other movable structure. The movable structure may be the same as the one of which a position is determined by the interferometer system, however it is also possible that the interferometer system is arranged to measure a position of one movable part, while another movable part of the lithographic apparatus may cause local (e.g. dynamic) variations of the physical quantity, and deteriorating an accuracy of the interferometer system.

SUMMARY

It is desirable to improve an accuracy of a determination of a position quantity when using an interferometer system.

According to an embodiment of the invention, there is provided a lithographic apparatus including a position quantity determination system to determine a position quantity of a movable part which is in operation at least partly surrounded by an area including a fluid, the position quantity determination system including: an interferometer system to determine a wavelength related position quantity parameter of the movable part, the interferometer system to transmit an optical measurement beam to the movable part through a part of the area; a global physical quantity determination system to determine a global value of a physical quantity of the fluid in the area; a local physical quantity determination system to determine a local value of the physical quantity of the fluid in the part of the area; and the position quantity determination system to determine the position quantity from the wavelength related position quantity parameter, the global value of the physical quantity and the local value of the physical quantity.

In another embodiment of the invention there is provided a position quantity determination system to determine a position quantity of a movable part which is in operation at least partly surrounded by an area including a fluid, the position quantity determination system including: an interferometer system to determine a wavelength related position quantity parameter of the movable part, the interferometer system to transmit an optical measurement beam to the movable part through a part of the area; a global physical quantity determination system to determine a global value of a physical quantity of the fluid in the area; a local physical quantity determination system to determine a local value of the physical quantity of the fluid in the part of the area; and the position quantity determination system to determine the position quantity from the wavelength related position quantity parameter, the global value of the physical quantity and the local value of the physical quantity.

According to a further embodiment of the invention, there is provided a position quantity determination method to determine a position quantity of a movable part which is in operation at least partly surrounded by an area including a fluid, the position quantity determination method including: determining an interferometer system a wavelength related position quantity parameter of the movable part, the interferometer system to transmit an optical measurement beam to the movable part through a part of the area; determining a global value of a physical quantity of the fluid in the area; determining a local value of the physical quantity of the fluid in the part of the area; and determining the position quantity from the wavelength related position quantity parameter, the global value of the physical quantity and the local value of the physical quantity.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
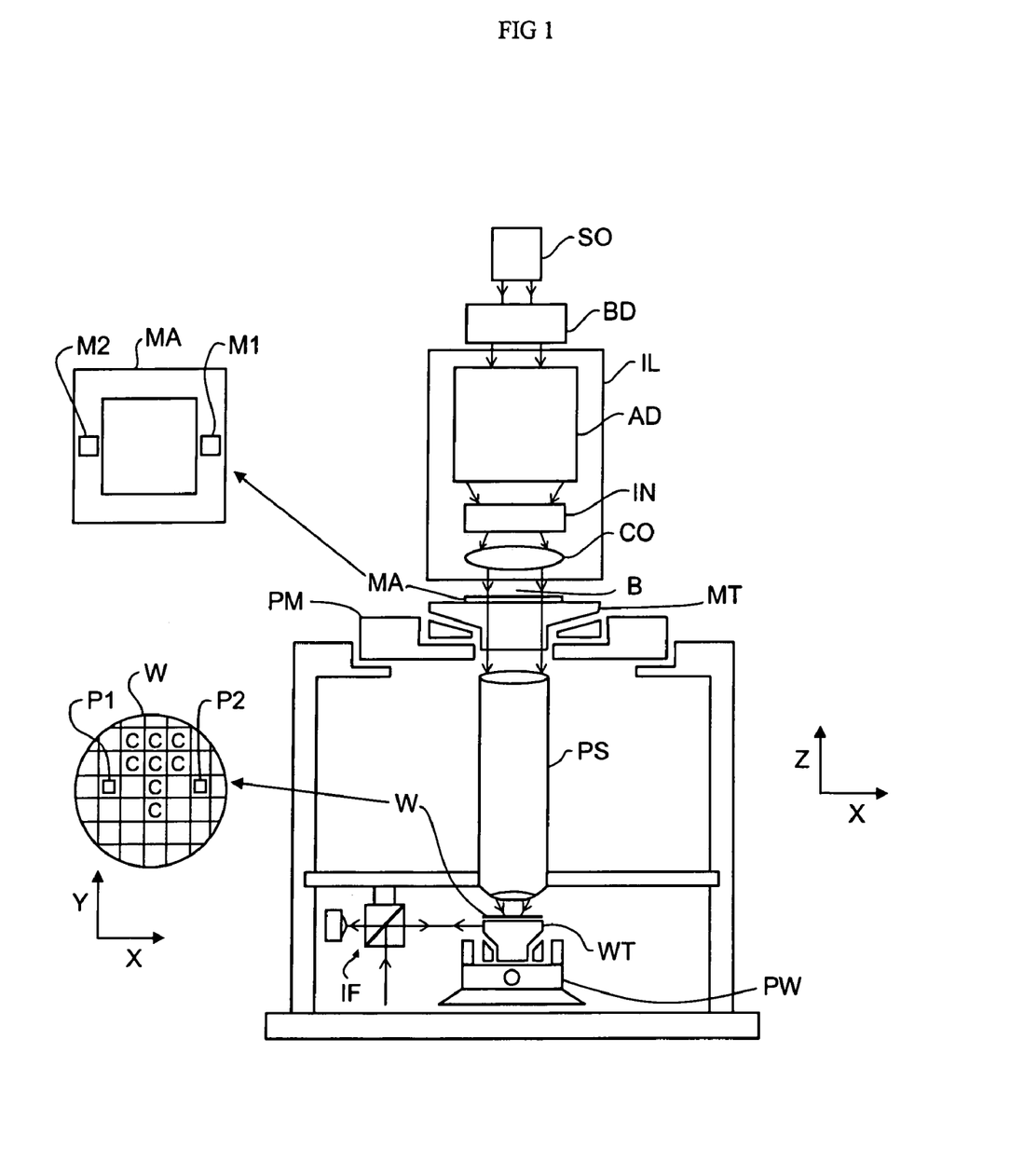
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

Scan mode: the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
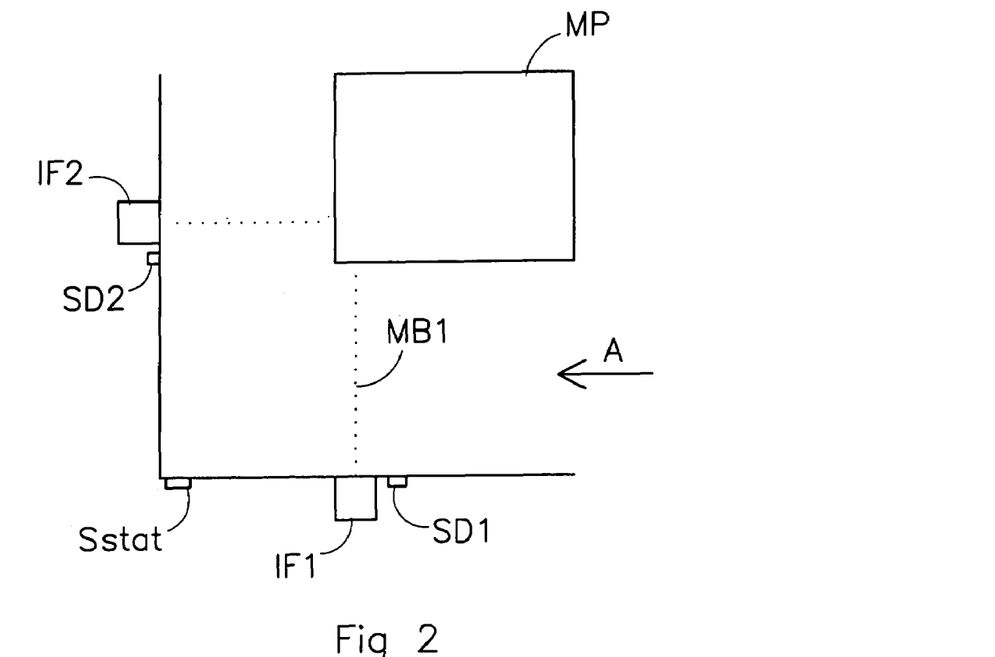
FIG. 2 schematically depicts a part of the lithographic apparatus according to an embodiment of the invention.

FIG. 2 shows a movable part MP which is at least partly surrounded by an area, such as a space, A. The movable part may include any movable part of a lithographic apparatus, such as a substrate table, a measurement stage, a reticle stage, etc. The area may have any shape and size, it may surround the movable part, however it is also possible that the area A is adjacent to a part of the movable part MP only, thus only partly surrounding the movable part MP. The area A is in operation filled with a fluid, such as a gas or a liquid. Examples of the gas may include a nitrogen, an air, a synthetic air (including e.g. oxygen and nitrogen) or any other suitable gas. The liquid may include, e.g., an immersion liquid for an immersion lithographic apparatus. The lithographic apparatus further includes an interferometer IF1 to send a measurement beam MB1 to the movable part MP. The measurement beam MB1 is reflected by the movable part and received back by the interferometer IF1. In this embodiment, the lithographic apparatus further includes a second interferometer IF2 to send a second measurement beam MB2 to the movable part. The second measurement beam MB2 is reflected by the movable part MP and received back by the second interferometer IF2. Each of the measurement beams MB1, MB2 passes through a part of the area A, thus passing through the fluid, which is comprised therein. The interferometer IF1 provides an output quantity which is representative of a first position quantity of the movable part, and the interferometer IF2 provides an output quantity which is representative of the second position quantity of the movable part MP. The position quantities of the movable part may include a position, a velocity, an acceleration, a jerk, etc. of the movable part. The position quantities may be single dimensional. However, it is also possible that the position quantities include a multi dimensional quantity. In the example shown in FIG. 2, an output of the interferometer IF1 is related to a position of the movable part along an axis which is substantially parallel to the measurement beam MB1. Similarly, an output quantity of the second interferometer IF2 provides a measure for a position of the movable part MP along an axis that is substantially parallel to the second measurement beam MB2.

FIG. 2 further shows a sensor Sstat to determine a global value of a physical quantity of the fluid. The physical quantity may include any physical quantity such as a temperature, a pressure, a density, etc. The global sensor which forms an example of a global physical quantity determination system, thus determines a global value, i.e., a global value of a physical quantity of the fluid, thus providing for an average value of the physical quantity of the fluid comprised in the area.

FIG. 2 further shows a local sensor SD1 to determine a local value of the physical quantity of a part of the fluid. The local sensor SD1 forms an example of a local physical quantity determination system. The sensor SD1 provides an output which is representative of a local value of the physical quantity of the fluid in the part of the area via which the measurement beam MB1 is transmitted. Thus, in the example wherein the local sensor SD1 includes a pressure sensor, the global sensor Sstat provides for a global value of the pressure, e.g., providing a measure for an ambient pressure, while the local sensor SD1 provides for an indication of local pressure variations, such as pressure transients, vibrations, etc. Similarly, the second local sensor SD2 provides for a second local value of the physical quantity in a second part of the area, in this example being the part of the area via which the second measurement beam is transmitted. The second local sensor SD2 forms an example of a second local physical quantity determination system.

In the context of this application, the term global (or global value) may, e.g., refer to an ambient or average value of the physical quantity, while the term local (or local value) may refer to a local value of the physical quantity in a part of the area comprising the fluid. In case that the physical quantity includes a pressure, the global value of the pressure may include an atmospheric pressure or an average pressure while the local value of the pressure includes a pressure in a part of the area comprising the fluid. The global and local values of the pressure may relate to pressure reading in a same frequency range, however may also be understood as relating to a complementary or at least partly overlapping frequency range. The term local may refer to a local value of the physical quantity, however the term local may also refer to a local variation of the physical quantity, thus a local deviation of the value of the physical quantity with respect to the global value. The term "part of the area" may refer to a part of the area via which the optical measurement beam is transmitted.

An operation of the embodiment shown in FIG. 2 will be described below. The interferometer IF1, which is similar to the second interferometer IF2, provides an output quantity which is dependent on a wavelength of the measurement beam, and therefore its output quantity is also indicated herein as a wavelength related position quantity parameter. Thus, when determining the position quantity from the output of the interferometer, it is desirable to have a measure for the wavelength of the measurement beam. Due to physical laws, the wavelength of the measurement beam depends on a variety of parameters which may include a pressure of the fluid via which the measurement beam is transmitted to the movable part, a temperature of this part of the fluid, etc. Thus, in order to obtain accurate measurements, it is desirable to have an indication of such physical parameter. Due to movements of the movable part movements of any other movable part of the lithographic apparatus or due to any other cause, variations and fluctuations in the physical quantity may occur. As an example, due to the movements of the movable part or of any other part in the lithographic apparatus, pressure waves, vibrations, or other pressure variations may be introduced in the fluid in the area. These variations or other changes have two-fold consequence. First, they may provide for changes which are too fast for the global sensor Sstat to be determined, and secondly the variations may differ for each part of the fluid in the area. It is, for example, possible that due to a movement of the movable part, or of any other movable part of the lithographic apparatus, a momentary pressure increase may be observed in a part of the fluid via which the measurement beam MB1 is transmitted, while a decrease in pressure, a slighter increase in pressure or any other value may be observed for the part of the fluid via which the second measurement beam MB2 is transmitted. According to an embodiment of the invention, the global value of the physical quantity as provided by the global sensor Sstat and the local value of the physical quantity as provided by the local sensor SD1, may now be applied when determining the position quantity of the movable part. This is illustrated in a block schematic fashion in FIG. 3.

Figure 3:
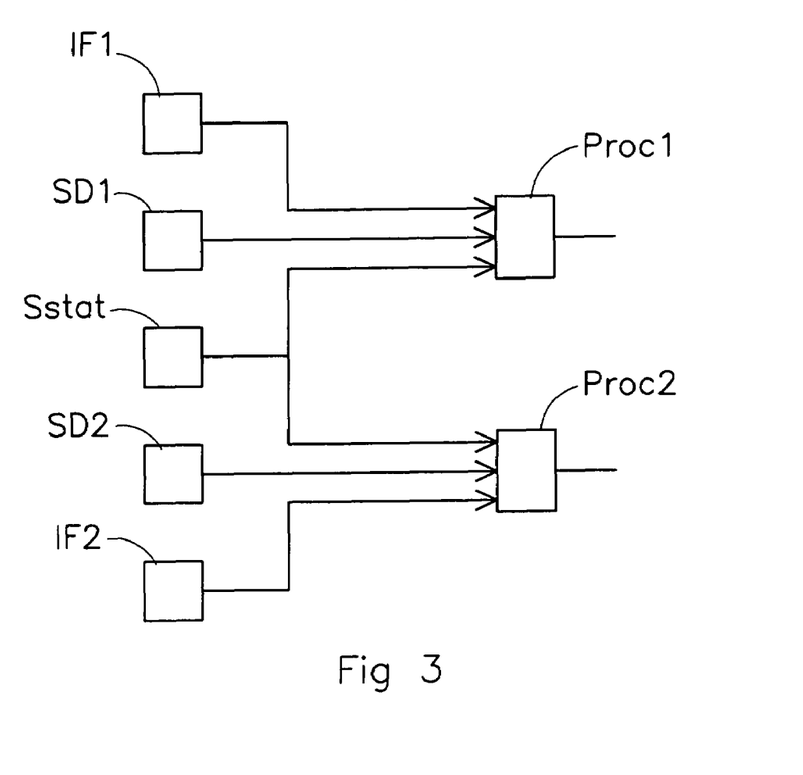
FIG. 3 depicts a block diagram of a position quantity determination system for a lithographic apparatus according to an embodiment of the invention.

FIG. 3 shows the global sensor Sstat, the local sensors SD1, SD2 and the interferometers IF1 and IF2. Further, FIG. 3 shows a first data processing device PROC1 such as a microprocessor, microcomputer, etc., and a second data processing device PROC2. Although depicted as separate structures the data processing devices PROC1 and PROC2 may also be comprised in a single data processing device or may be formed by separate software modules or software instructions to be executed on a single or on separate data processing means. The first processing device PROC1 determines the position quantity of the movable part making use of an output of the interferometer IF1, an output of the local sensor SD1 and an output of the global sensor Sstat. The interferometer IF1 provides a wavelength related position quantity parameter to the processing device PROC1, from this wavelength dependent parameter, the processing device PROC1 determines the position quantity taking into account the momentary value of the physical quantity at the part of the area via which the measurement beam MB1 is transmitted. The momentary value of the physical quantity in this part of the area is derived from a combination of the global value of the physical quantity as provided by the global sensor and the local value as provided by the local sensor SD1. Similarly, the second processing device determines the second position quantity making use of the output of the second interferometer, the second local sensor SD2, and the global sensor Sstat.

The lithographic apparatus as described herein thus includes a position quantity determination system including an interferometer, a global physical quantity determination system, a local physical quantity determination system and a device to determine the position quantity from the output as provided by the interferometer, the global physical quantity determination system and the local physical quantity determination system. Such device may, e.g., include a processing device as described with reference to FIG. 3.

The local value of the physical quantity may deviate from the global value due to, e.g., a movement of the movable part of the lithographic apparatus or of any other movable part of the lithographic apparatus. It is therefore beneficial to position the global sensor such that a measurement by this sensor is not or substantially not affected by a local deviation of the physical quantity. The global sensor may be positioned sufficiently remote from movable parts of the lithographic apparatus and/or may be positioned at a location where it is, e.g., shielded to a large extent from any local influences on the physical quantity caused by e.g. a movement of any movable part. Also, it is possible, in case that the local deviations are in a certain frequency band only, that the global sensor is provided with a filter (e.g., an electrical or electronic filter or a digital filter) to filter away this frequency band.

Due to the use of a global sensor and a local sensor, a higher accuracy of determination of the physical quantity can be obtained: the inventors have devised that the global sensor (or in more general words the global physical quantity determination system) and the local sensor (or in more general words the local physical quantity determination system) may complement each other, as the global sensor may, e.g., include beneficial properties such as a high accuracy, while properties which the global sensor lacks, such as a high speed of response, may be provided by the local sensor. In the example where the physical quantity comprises a pressure, the global sensor may, e.g., include a pressure sensor providing an accurate read out of pressure, while the local sensor may, e.g., include an acoustic sensor such as a microphone (or in general any dynamic pressure sensor) or other vibration sensor which, e.g., provides for a high speed of response. Furthermore, the local sensor may be positioned as close a possible to the part of the area via which the measurement beam is transmitted, to provide a determination of the local value of the physical quantity in the respective part as accurate as possible. The global sensor however is not necessarily required to be in the same position, As shown in FIG. 2, a single global sensor may be applied in combination with two (or in more general term, a plurality of) local sensors as the global component of the physical quantity as detected by the global sensor shows less dependency on a positioning of the global sensor, as the global value of the physical quantity may be substantially equal over the area or at least a relevant part of the area.

Figure 4:
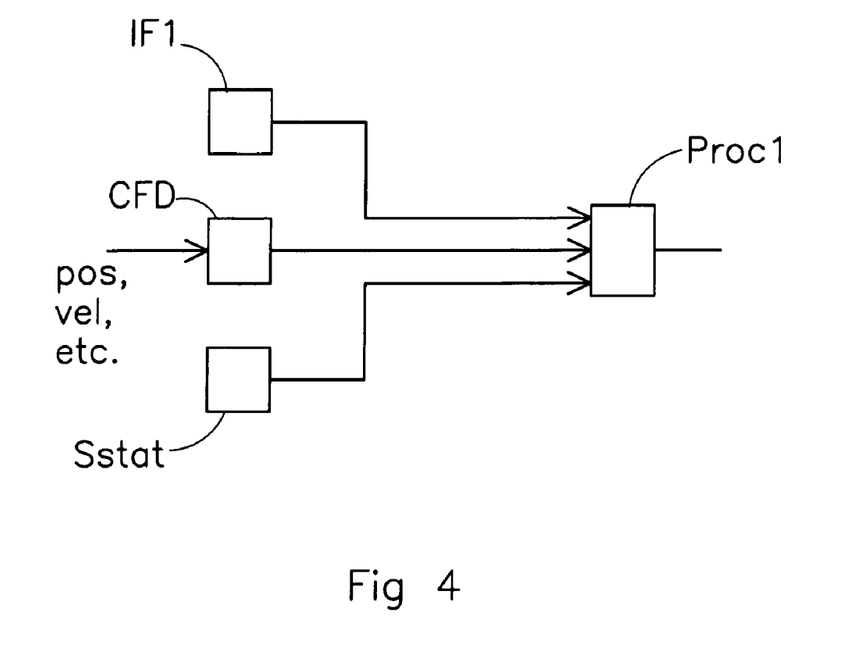
FIG. 4 depicts a block diagram of the position quantity determination system for a lithographic apparatus according to an embodiment of the invention.

Instead of, or in addition to, using sensors as described above, it is also possible to make use of a computational model, such as a computational fluid dynamics model to determine the physical quantity of the fluid. The model may be provided with one ore more variables, such as a position, speed, etc. of the movable part or other movable parts, as well as other properties of the fluid, such as its temperature. Making use of such input, the computational fluid dynamics model may calculate therefrom a desired physical quantity, such as a pressure, in the part of the area via which the respective measurement beam is transmitted. A computational fluid dynamics model may be seen as a finite element model for a fluid such as a liquid or a gas (instead of for a solid structure). A benefit of using computational fluid dynamics model is that it uses less sensors. The computational fluid dynamic model may, e.g., be combined with a single global sensor which provides an output representing a global value of the physical quantity to be determined. An example of a position quantity determination system for lithographic apparatus including such computational fluid dynamics model is depicted in FIG. 4. The computational fluid dynamics model CFD is provided with a plurality of input parameters, such as a position, velocity, acceleration of the movable part and the models determines a pressure therefrom. The pressure as determined by the computational fluid dynamics model CFD, a global pressure provided by a pressure sensor and an output of the interferometer IF1 are provided to a processing device PROC1 to determine the position quantity of the movable part. Thus, as compared to the principle described with reference to FIGS. 2 and 3, a difference is that the local sensor is replaced by a computational fluid dynamics model. The computational fluid dynamics model may not only be applied for approximating a pressure, but may of course be applied for providing an indication of any suitable physical quantity.

Figure 5:
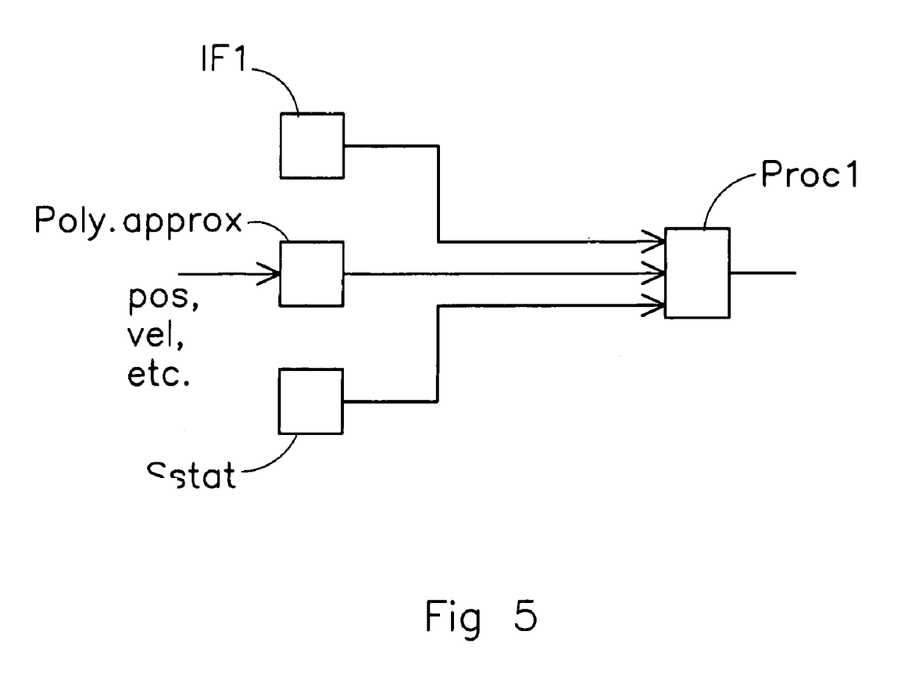
FIG. 5 depicts a block diagram of the position quantity determination system for a lithographic apparatus according to an embodiment of the invention.

In a further alternative embodiment, the local physical quantity determination system includes a mathematical approximation model (such as a polynomial approximation model) to approximate the local physical quantity value from a physical parameter of the lithographic apparatus. The physical parameter may, e.g., include a position, velocity and/or acceleration of the movable part or of any other movable part of the lithographic apparatus. The physical parameter may be measured by a suitable measurement system. However, it is also possible that a value of the physical parameter is a set point value of a control system for the respective movable part. An advantage as compared to the computational fluid dynamics model described above is that a mathematical or polynomial approximation model requires less processing operation, and thus less processing power to determine the physical quantity. In the case of the polynomial approximation model may, e.g., include a polynome determining a value of the physical quantity (e.g. pressure) as polynomial function of a position, velocity and acceleration of the movable parts. An example of such embodiment is depicted in FIG. 5, where the polynomial approximation model is, similar to the CFD model as described with reference to FIG. 4, provided with a plurality of input parameters such as in this example a position, velocity, etc. of the movable parts, and the polynomial approximation model deriving a pressure or any other required physical quantity therefrom. This physical quantity, together with an output of the interferometer and an output of the global sensor is provided to the processing device to determine the position quantity (such as the position of the movable part).

In the embodiment described in FIGS. 4 and 5 as well as in the other above embodiments, a position or other position quantity of the movable part is determined, while in some of the embodiments, a position may also be an input quantity for the CFD model, polynomial model, etc. A difference between these two values of the position may be found in their accuracy, an object of the position quantity determination system may be to accurately determine a position making use of the interferometer. The model however may be supplied with a more coarse, hence less accurate approximation of the position or any other position related quantity, thus the position information as provided to the computational fluid dynamics model or polynomial model may be derived from another sensor or other position information in the lithographic apparatus which may have a lower accuracy than the position or other position quantity which is determined by the position quantity determination system as described here. The mathematical (such as the polynomial) approximation model may be calibrated by performing measurements (e.g. to measure the local physical quantity value as a function of the physical parameter). However, it is also possible that the mathematical or polynomial approximation model is calibrated using a computational fluid dynamics model. This provides as advantage that accuracy and versatility of the computational fluid dynamics model may be benefited from as its output is applied for performing the calibration, while at the same time avoiding complex calculations which require more processing by the processing device than the relatively simple calculations by the mathematical or polynomial approximation model.

The skilled person will understand that the position quantity determination system as described above for use in a lithographic apparatus may not only be applied for a lithographic apparatus, but may be applied in any apparatus where an interferometer is used for position measurements or distance measurements.

As explained above the interferometer system determines a wavelength related position quantity parameter. It is possible that this parameter includes a distance, the interferometer thus calculating a distance, which is then corrected for the value of the physical quantity making use of the outputs of the global and local physical quantity determination systems. Also, it is possible that the interferometer provides a wavelength related output parameter only, such as a wavelength count, or any other interference related quantity. In that case, the position quantity such as the position may thus not yet have been calculated by the interferometer itself, the outputs of the global and local physical quantity determination systems thus not being used to correct a position quality as determined by the interferometer by itself, but the outputs of the global and local physical quantity determination systems being used when determining the position quantity, e.g. being used to calculate a wavelength. The interferometer may include any type of interferometer making use of any interferometer measurement principle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a position quantity determination system to determine a position quantity of a movable part, said movable part being at least partly surrounded by an area comprising a fluid, the position quantity determination system comprising:
   an interferometer system configured to determine a wavelength related position quantity parameter of the movable part, the interferometer system being configured to transmit an optical measurement beam to the movable part through a part of the area;
   a global physical quantity determination system to determine a global value of a physical quantity of the fluid in the area; and
   a local physical quantity determination system to determine a local value of the physical quantity of the fluid in the part of the area;
   wherein the position quantity determination system is configured to determine the position quantity from the wavelength related position quantity parameter, the global value of the physical quantity and the local value of the physical quantity.

2. The lithographic apparatus according to claim 1, further comprising a second interferometer system configured to determine a second wavelength related position quantity parameter of the movable part, the second interferometer system being configured to transmit a second optical measurement beam to the movable part through a second part of the area; a second local physical quantity determination system configured to determine a second local value of the physical quantity in the second part of the area; wherein the second interferometer system is configured to determine the second position quantity from the second wavelength related position quantity, the global value of the physical quantity and the second local value of the physical quantity.

3. The lithographic apparatus according to claim 1, wherein the physical quantity comprises a pressure.

4. The lithographic apparatus according to claim 3, wherein the local physical quantity determination system comprises an acoustic sensor or a fast pressure sensor.

5. The lithographic apparatus according to claim 1, wherein the local physical quantity determination system comprises a computational fluid dynamics model.

6. The lithographic apparatus according to claim 1, wherein the local physical quantity determination system comprises a mathematical approximation model to approximate the local value of the physical quantity from a physical parameter of the lithographic apparatus.

7. The lithographic apparatus according to claim 6, wherein the physical parameter of the lithographic apparatus comprises one or more of a position of the movable part, a velocity of the movable part, an acceleration of the movable part, a position of another movable part of the lithographic apparatus, a velocity of the other movable part of the lithographic apparatus, and an acceleration of the other movable part of the lithographic apparatus.

8. The lithographic apparatus according to claim 6, wherein the mathematical approximation model has been calibrated with a computational fluid dynamics model.

9. The lithographic apparatus according to claim 6, wherein the mathematical approximation model has been calibrated with measurements of the value of the local physical quantity as a function of the physical parameter.

10. The lithographic apparatus according to claim 1, wherein the position quantity comprises one or more of a position, a velocity, an acceleration and a jerk.

11. The lithographic apparatus according to claim 1, wherein the wavelength related position quantity parameter includes a position, a velocity, an acceleration or a jerk.

12. A position quantity determination system configured to determine a position quantity of a movable part, said movable part being at least partly surrounded by an area comprising a fluid, the position quantity determination system comprising:
    an interferometer system configured to determine a wavelength related position quantity parameter of the movable part, the interferometer system being configured to transmit an optical measurement beam to the movable part through a part of the area;
    a global physical quantity determination system configured to determine a global value of a physical quantity of the fluid in the area;
    a local physical quantity determination system configured to determine a local value of the physical quantity of the fluid in the part of the area;
    wherein the position quantity determination system is configured to determine the position quantity from the wavelength related position quantity parameter, the global value of the physical quantity and the local value of the physical quantity.

13. A position quantity determination method for determining a position quantity of a movable part which is in operation at least partly surrounded by an area comprising a fluid, the position quantity determination method comprising:
    determining a wavelength related position quantity parameter of the movable part with an interferometer system, the interferometer system being configured to transmit an optical measurement beam to the movable part through a part of the area;
    determining a global value of a physical quantity of the fluid in the area;
    determining a local value of the physical quantity of the fluid in the part of the area;
    determining the position quantity from the wavelength related position quantity parameter, the global value of the physical quantity and the local value of the physical quantity; and
    supplying or making available the position quantity for further analysis or processing.

14. The method of claim 13, wherein the physical quantity comprises a pressure.

15. The method of claim 14, wherein the local physical quantity determination system comprises an acoustic sensor or a fast pressure sensor.

16. The method of claim 13, wherein the local value of the physical quantity of the fluid is determined with a computational fluid dynamics model.

17. The method of claim 13, wherein the position quantity comprises one or more of a position, a velocity, an acceleration and a jerk.

18. The method of claim 13, wherein the wavelength related position quantity parameter includes a position, a velocity, an acceleration or a jerk.

* * * * *